US008797029B2

(12) United States Patent
Zhu et al.

(10) Patent No.: US 8,797,029 B2
(45) Date of Patent: Aug. 5, 2014

(54) MAGNETIC RESONANCE SIGNAL DETECTION USING REMOTELY POSITIONED RECEIVE COILS

(75) Inventors: Haoqin Zhu, Winnipeg (CA); Labros Petropoulos, Winnipeg (CA); Wayne Schellekens, Winnipeg (CA); John Saunders, Winnipeg (CA)

(73) Assignee: Imris Inc, Winnipeg, MB (CA)

( * ) Notice: Subject to any disclaimer, the term of this patent is extended or adjusted under 35 U.S.C. 154(b) by 462 days.

(21) Appl. No.: 13/090,816

(22) Filed: Apr. 20, 2011

(65) Prior Publication Data

US 2012/0268116 A1    Oct. 25, 2012

(51) Int. Cl.
*G01V 3/00* (2006.01)
*G01R 33/48* (2006.01)

(52) U.S. Cl.
USPC .......... 324/307; 324/309; 324/318; 324/322; 600/410; 600/421

(58) Field of Classification Search
CPC .......... G01R 33/483–33/4836; G01R 33/5611
USPC ............................ 324/300–322; 600/407–464
See application file for complete search history.

(56) References Cited

U.S. PATENT DOCUMENTS

| 4,680,549 | A | | 7/1987 | Tanttu |
| 5,473,252 | A | | 12/1995 | Renz |
| 5,722,410 | A | * | 3/1998 | NessAiver .................. 600/422 |
| 6,263,229 | B1 | * | 7/2001 | Atalar et al. ................. 600/423 |
| 6,404,199 | B1 | * | 6/2002 | Fujita et al. .................. 324/318 |
| 7,725,160 | B2 | * | 5/2010 | Weber ........................... 600/423 |
| 2002/0060568 | A1 | | 5/2002 | Greim |
| 2009/0096456 | A1 | | 4/2009 | Biber |
| 2009/0160441 | A1 | * | 6/2009 | Dohata et al. ................. 324/309 |

FOREIGN PATENT DOCUMENTS

WO    2006048816    5/2006

OTHER PUBLICATIONS

Wirth E D et al: "A Comparison of an Inductively Coupled Implanted Coil with Optimized Surface Coils for In Vivo NMR Imaging of the Spinal Cord", Magnetic Resonance in Medicine, Academic Press, Duluth, MN, US, vol. 30, No. 5, Nov. 1, 1993, pp. 626-633.

* cited by examiner

*Primary Examiner* — Melissa Koval
*Assistant Examiner* — Emily Chan
(74) *Attorney, Agent, or Firm* — Adrian D. Battison; Ade & Company Inc

(57) ABSTRACT

The receive coil arrangement includes an inner coil adjacent the part to be imaged so as to maximize the received MR signal and an outer coil, which may be the built in body coil of the magnet, connected by cable to the signal processing system. Both the coils are individually tuned to the common resonant frequency and the receive coil include an arrangement to halt current flow therein during the transmit stage. The first coil has no cable and is arranged to communicate the MR signal therein to the signal processing system through the outer coil by inducing the MR signal onto the outer coil. Despite inherent losses by interfering with the tuning of the loops and in the inductive coupling this magnifies the MR signal and makes the first coil wireless. Arrangements are provided for generating from the output of the second coil separate signals for separate channels of the signal processing unit.

25 Claims, 8 Drawing Sheets

MAGNETIC RESONANCE SIGNAL DETECTION USING REMOTELY POSITIONED RECEIVE COILS

This invention relates to an RF receive coil assembly for MR imaging.

BACKGROUND OF THE INVENTION

As is well known, MR imaging uses an RF receive coil to receive the signals emitted by the subject under test in response to excitation of a selected volume of the subject. Thus the Gradient coils generate controlled variations in the main magnetic field (B0) magnetic field to produce selected spatial excitation volume and the signal emitted by that selected volume is picked up by the receive coil arrangement and transmitted to a signal processing system.

The receive coil arrangement can comprises a single coil loop or element or it can include a series of loops arranged in a pattern around the part of the subject to be imaged.

Hereinafter, the term "loop" is used for one component or element of a complex receive coil arrangement and this term is not intended to limit the shape or structure of the individual elements defined by this term. Typically each loop is a single loop with a conductive wire or other conductive material so that current flows around the loop in response to the signal. Different materials can be used for the conductive material and certainly the terms used herein are not limited to specific materials which can be used.

Normally, each individual loop or loops of the MRI receive coil arrangement are connected to a single receiver of the signal processing system via preamplifier and other components with a cable.

Such receive coil arrangements can therefore use the so called "built in body coil" carried on the magnet as receive coil which is connected by cable to the signal processing system. In this case the so called "built in body coil" is also used as transmit coil Such receive coil arrangements can therefore comprise a single loop which is connected by a single wire to a single channel of the signal processing system. In this case the system can use the so called "built in body coil" carried on the magnet as transmit coil. This signal loop received coil then supplies the received signal collected around the subject, typically a lying patient, and communicates it to the single channel for processing using conventional systems well known to persons in this art.

Such receive coil arrangements can therefore comprise a multiple loop arrangement including a so-called "phased array" of loops each of which is connected by a respective wire to a separate one of a plurality of channels of the signal processing system.

In this case the system typically uses a portable coil assembly arranged to wrap around the body part of the patient but each loop must have its own set of processing components and its own wire connecting the signal to the separate channel for processing.

However in recent developments not yet widely adopted, the "built in body coil" carried on the magnet as the receive coil arrangement is separated into individual loop components for supplying a separate signal to the separate channels.

It is well known that there are parallel imaging techniques to reduce the time necessary to obtain a complete scan of the part of the patient by using the signals from the separate channels to carry out various calculations and extrapolations, thus avoiding the necessity to obtain image results at each location in the image space or in K-space. Some of these parallel imaging techniques are known as SMASH and SENSE and GRAPPA.

To obtain better images, the preamplifiers are located as close to the coil elements as possible. Although the size of MR preamplifier is greatly reduced recently, it still takes much space of overall array coil. In addition the area of coil enclosure at preamplifier must be rigid.

The coil cable, as is well known, consists of multi-coaxial cable and signal control wires and outer shield. Common mode current or shield current will be generated on outer surface of the shield during transmit phase by the high RF field generated by the transmit coil. To prevent the patient from being overheated dangerously by shield current, cable traps are required for the coil cable assembly. Longer cable with more cable traps is required for the clinic applications, such as intra-operative MR imaging on a moving magnetic system.

SUMMARY OF THE INVENTION

According to the invention there is provided an apparatus for MR imaging of a subject comprising a MR magnet with gradient coil operable to generate a variable magnetic field to be applied to the subject;

an RF transmit coil arrangement for generating an RF pulse in a transmit stage to be applied to the subject to be imaged such that the subject generates an MR signal in response to the magnetic field and the RF pulse applied;

a receive coil arrangement for acquiring the MR signal in a receive stage;

and a signal processing system for receiving the MR signal for carrying out signal processing by which an image is generated;

the receive coil arrangement comprising:

at least one first loop arranged to be located adjacent the subject so as to receive the MR signal;

at least one second loop arranged to be located adjacent said at least one first loop;

said at least one second loop having a signal communication cable connected to the signal processing system for transferring the MR signal therein to the signal processing system;

said at least one second loop and said at least one first loop being individually tuned to a common resonant frequency for receiving said MR signal;

all coil loops of said at least one first loop and said at least one second loop which act only in the receive stage and do not transmit the applied RF pulse in the transmit stage having therein an arrangement to halt current flow therein during the transmit stage so as to prevent the presence of said all coil loops from interfering with the RF pulse during the transmit stage;

said at least one first loop being arranged to communicate the MR signal therein to the signal processing system through said at least one second loop by inducing the MR signal onto said at least one second loop.

The intention in the above arrangement is that said the first coil is free from a wired cable carrying the MR signal to the signal processing system. This can provide a number of significant advantages.

A number of possible arrangements can be used within this broad definition.

Firstly the second coil can be is a built in body coil carried on the magnet. Such body coils are typically available on magnet systems.

The second coil or body coil can act as the transmit coil or another dedicated coil can be separately used.

There can be only two coils using the inductive coupling to transfer the signal to the processor or there may be a stack of three coils or even more.

In this arrangement, the first coil can be located inside the body of a patient and the second coil is arranged outside the body of the patient. Typically in this arrangement, the second coil is as close as possible to the exterior of the patient and this in turns communicates inductively to the body coil (or other coil) around the patient.

The first coil is arranged to be located as close as physically possible to the subject and the second coil is arranged to be located at a position spaced from the subject greater than that of the first coil so as to receive the signal inductively and transfer it to the processing unit.

The arrangement herein is predicated on the discovery that providing a first coil as close as possible to the part to be imaged and covering as small a volume as possible generates a signal which has significantly greater signal to noise ratio than a second coil located at a spacing from the part. Then the signal picked up by the first coil is communicated inductively to the second coil even though there are significant losses in so doing. It has been found that the signal from the first coil is induced onto said at least one second loop at an efficiency of induction (less than 100%) sufficient that that the MR signal on second coil is greater than the MR signal which would be generated in the absence of the first coil. This includes the possibility of a catheter coil being used which increases the signal to the surface coil. That is there is a magnifying effect by providing the first coil close to the subject and then communicating the signal to the second coil despite the losses in the inductive coupling.

Another issue which arises is that mutual inductance between the coils can change the tuned common resonant frequency of the loops to reduce the MR signal unacceptably. Typically therefore it would be considered that the problems of mutual inductance changing the tuned frequency would at least balance and more likely outweigh the advantages obtained by providing the additional first coil. However this has been found not to be so. Provided the distances are carefully managed by experiments to determine what distances provide an advantage without adversely affecting the tuning to a situation where the MR signal is at a value which is less than the MR signal which would be generated in the absence of said at least one first loop, significant advantages can be obtained.

One issue which arises and is addressed herein is that of how to generate separate signals for separate channels of the signal processing unit in order to take advantage of the high speed imaging which can be obtained by using parallel channels such as by SENSE or SMASH or other more recent techniques. Preferably each loop includes an addressable switch operable remotely to halt flow of current in the loop so that each loop can be activated in turn.

In a first embodiment to overcome this difficulty, the first coil includes a plurality of separate loops and there is provided an arrangement for generating the separate MR signal for the separate channels from the signal induced onto the second coil.

In one arrangement, each first loop includes an addressable switch operable remotely to halt flow of current in the first loop. In this way each first loop can be activated in turn. In this arrangement using conventional MRI equipment where the body coil has a single output. In this arrangement, the individual element sensitivity profiles can be obtained to perform parallel imaging. A signal processing system is arranged to receive the signal from the single channel, and along with the sensitivity profiles will separate the combined single channel into its individual elements for processing by the scanner. The individual signals from coils can be determined by measuring what are known as the Sensitivity Profile and Noise Correlation Matrix of the coil using those factors to determine the individual signals for the separate channels. In this arrangement, the sensitivity profile and possibly Noise Correlation Matrix of the single second coil can be determined by operating the switch to turn off each of the first coils. After this is determined, the sensitivity profile and Noise Correlation Matrix of each of the first loops can be determined by activating only each one in turn with the others turned off and then by subtracting the signal obtained from single second coil from the total signal obtained by the second coil and the activated one of the first loops. The Sensitivity Profile and possibly the Noise Correlation Matrix are then used to determine from the single output of the single second receive coil the required individual signals required for the separate channels of the processing system. For the parallel imaging, a base image is obtained with RF body coil only. Utilizing the switching of the individual loops, an image for each of the inductive loops is obtained in succession as well as any possible combination of them. Thus, by a subtraction of images from the body coil base image, a picture of the sensitivity fields and correlation matrices between coils is obtained. Once this arrangement is obtained an under sampling during the parallel imaging can be unfolded. This technique can be extended in space and time domain as well with methods like GRAPPA.

In a second arrangement applicable to arrangements with a body coil which has separate loops connected to separate channels, the arrangement of the body coil has been found to provide the required signal to each respective one of the channels.

In accordance with another important aspect of the invention, the coil is provided with a switch which acts to deactivate the coil after a period of time. Thus the switch can be moved to open circuit when a time period after first activation has elapsed. In this way, the active life of the coil can be controlled. This can be limited for example to a number of hours so that the coil is a one time use product. Thus the switch is activated on receipt of the first RF pulse and then has a timing circuit which times out to operate the switch to open circuit preventing further use of the coil assembly. In another arrangement, the switch may act in response to sterilization so that it allows a certain number of sterilizing actions before moving to open circuit. In yet another arrangement, the total allowable lifetime of the coil can be predetermined by the manufacturer and then actively enforced against users who may try to use the product beyond its life. This arrangement allows the coil to be a one time use product requiring it to be discarded after the one time use with this protocol being fully enforced against users wanting to ignore it.

In order to make the product disposable, components can be provided to control the operation of the loops which avoids the use of higher cost components such as transistors and variable elements. This can be achieved by using de-tuning of the coil to switch the coil when it is not required to respond to the RF signal. Thus de-tuning of the coil to a resonant frequency sufficiently different from the RF frequency is equivalent or achieves the same result as switching the loop to open circuit. This can be achieved in many ways and in particular by moving of a cooperating coil to a position close to the coil to change the tuning.

In order to ensure the separate loops are de-coupled so as to avoid interfering with the resonant tuning, conventional decoupling techniques can be used including geometric arrangements of the loops, capacitive de-coupling, inductive decoupling and the use of a separate additional loop which acts to inductively couple between two of the separate loops to provide the necessary current cancelling actions necessary to provide the de-coupling between the two separate loops. All of these techniques are known to persons skilled in the art.

According to a second aspect of the invention there is provided a method for MR imaging of a subject comprising operating an MR magnet with gradient coil to generate a variable magnetic field to be applied to the subject;

operating an RF transmit coil arrangement for generating RF pulses in a transmit stage to be applied to the subject to be imaged such that the subject generates an MR signal in response to the magnetic field and the RF signal applied;

providing a receive coil arrangement for acquiring the MR signal in a receive stage;

processing the MR signal by which an image is generated;

defining the receive coil arrangement by:

at least one first loop located adjacent the subject so as to receive the MR signal;

at least one second loop located adjacent said at least one first loop;

communicating the RF signal in said at least one second loop by a signal communication cable connected to the signal processing system;

tuning said at least one second loop and said at least one first loop to a common resonant frequency for receiving said MR signal;

preventing the presence of said all coil loops from interfering with the MR signal during the transmit stage;

and communicating the MR signal in said at least one first loop to the signal processing system through said at least one second loop by inducing the MR signal thereon onto said at least one second loop.

According to a third aspect of the invention there is provided a method for MR imaging of a subject comprising operating an MR magnet to generate a variable magnetic field to be applied to the subject;

operating an RF transmit coil arrangement for generating an RF signal in a transmit stage to be applied to the subject to be imaged such that the subject generates an MR signal in response to the magnetic field and the RF signal applied;

providing a receive coil arrangement for acquiring the MR signal in a receive stage;

processing the MR signal in a plurality of separate channels from which an image is generated;

defining the receive coil arrangement by:

a plurality of first loops located adjacent the subject so as to receive the MR signal;

a single second loop located adjacent said plurality of first loops;

communicating the RF signal in said single second loop by a signal communication cable connected to the signal processing system;

tuning said single second loop and said plurality of first loops to a common resonant frequency for receiving said MR signal;

preventing the presence of said all coil loops from interfering with the MR signal during the transmit stage;

and communicating the MR signal in said plurality of first loops to the signal processing system through said single second loop by inducing the MR signal thereon onto said at least one second loop;

and generating separate MR signals for the separate channels from the signal induced onto said single second loop.

According to a fourth aspect of the invention there is provided a method for MR imaging of a subject comprising operating an MR magnet with gradient coil to generate a variable magnetic field to be applied to the subject;

operating an RF transmit coil arrangement for generating RF pulses in a transmit stage to be applied to the subject to be imaged such that the subject generates an MR signal in response to the magnetic field and the RF signal applied;

providing a receive coil arrangement for acquiring the MR signal in a receive stage;

processing the MR signals in a plurality of separate channels from which an image is generated;

defining the receive coil arrangement by:

at least one first loop located adjacent the subject so as to receive the MR signal;

a plurality of second loops located adjacent said at least one first loop;

communicating the RF signal in each of said second loops by a respective signal communication cable to a respective channel of the signal processing system;

tuning said plurality of second loops and said plurality of first loops to a common resonant frequency for receiving said MR signal;

preventing the presence of said all coil loops from interfering with the MR signal during the transmit stage;

and communicating the MR signal in said at least one first loop to the signal processing system through said plurality of second loops by inducing the MR signal thereon onto said second loops.

The coil size (with built in preamplifiers) and cable are the primary issues that affect coil performance, workflow, sterilization and safety. This new design described herein can greatly improve coil performance, workflow, sterilization and safety, since it does not include any of these components.

In the arrangement where the first coil is a phased array including a plurality of separate loops, one or more loops of the phased array coil are without preamplifiers and no cables, no physical connection to the scanner, thus providing a so called "wireless coil". These wireless coil elements are resonators and tuned at MR scanner working frequency. These wireless coil elements or loops are decoupled from each other using conventional techniques by coil loop overlap, capacitive techniques including shared conductor, inductive and geometry (such as quadrature) methods. These wireless coil elements can be transverse electromagnetic (TEM) coil and receive only coils with good decoupling between coil elements by using current technology without cable and preamplifier.

These wireless coil elements are inductively coupled in the receive stage to the built in RF body coil. In a multiple system using additional coils, these wireless coils can couple with each other in a successive manner to larger and/or smaller coils that consequently couple to the built in RF body coil. These coils are passively detuned from the Transmit portion of the TX/RX Whole Body RF coil or other transmit coil during the transmit stage.

The frequency of operation covers the entire spectrum of RF. The wireless coil elements combination can be inductive coupled multi loops along the magnet axis or off axis.

The coil elements are passively decoupled from transmit coil during the transmit stage. The transmit coil can be the built in body coil in the MR scanner or can be a local transmit coil or transmit phased array. Or a transceiver coil can work with a multi transmitter system. The wireless coil elements size can be as large as head or body coil and as small as intra-cardiac coil (diameter<10 mm).

The sensitivity of the wireless coil elements can be adjusted by de-tune, insert impedance and other methods to eliminate coil crosstalk and optimize signal to noise ratio.

The distance between wireless coil elements and pickup coils can be adjusted for optimized SNR bearing in mind the competing requirements of reducing mutual inductance to prevent de-tuning and maximizing signal transfer efficiency.

The distance between wireless coil elements and subject to be imaged can be adjusted for optimized SNR bearing in mind the competing requirements of reducing load and keep the Q factor higher of each coil elements, so that each coil element can get the maximum MR signal from the subject to be imaged.

The arrangement described herein may have one or more of the following advantages or features:

The wireless coil elements can be rigid, flexible or any combination

The wireless coil elements can be sterilized, reusable, limited reusable and disposable. The wireless coil can be shaped to match required operations such as with openings at the required locations.

Can be manufactured very cheaply so as to be disposable.

Have no wires so that they can be left in place during the whole procedure.

Very flexible so can conform more accurately to the patient body.

These wireless coil elements can be made radiolucent for use with X-ray or radiation treatment using such techniques as aluminum coil material and the material of atomic number Z≤30 with or without Gold and silver plate.

The geometry of these wireless coil elements can be any shape such as, but not limited to: round, rectangular, butterfly, microstrip-based coil, or microstrip transmit line (MTL coil).

In arrangements where the magnet is movable for intra-operative procedures, as there are no cables, the first coil can be left in place.

In such arrangements the cables are typically very long so that the absence of a cable at all is of increased advantage.

As the first coil can be much smaller, the signal to noise ratio which is dependent on the amount of noise generated within the volume of the coil is much reduced.

The signals generated by the first close coil and by the more remote second coil are added at the second coil since the second coil remains responsive to the signal directly from the subject. While this in many cases has been found not to be a large effect, it still adds the quality of the resultant signal.

BRIEF DESCRIPTION OF THE DRAWINGS

One embodiment of the invention will now be described in conjunction with the accompanying drawings in which.

In the drawings like characters of reference indicate corresponding parts in the different figures.

DETAILED DESCRIPTION

The apparatus for MR imaging of a subject includes a conventional cylindrical MR magnet 10 operable by a field control system to generate a variable magnetic field to be applied to the subject.

The MR system includes an RF transmit arrangement 12 for generating RF pulses in a transmit stage to be applied to the subject to be imaged and a receive arrangement for acquiring the MR signal in a receive stage with a signal processing system 13 for receiving the MR signal for carrying out signal processing by which an image is generated. As is well known, the subject generates an MR signal in response to the magnetic field and the RF signal applied which is detected and processed to generate an image. The arrangement is well known and a suitable system is available from Siemens.

Typically the magnet 10 carries an RF coil known as a body coil 14 which is mounted on the cylindrical magnet housing so as to surround the patient. This is usually used as the transmit coil. However separate transmit can be used. The body coil can also operate as the receive coil. However again separate receive coils can be used. The transmit and receive coils can be the same coils or can be provided by separate coils.

Figure 1:
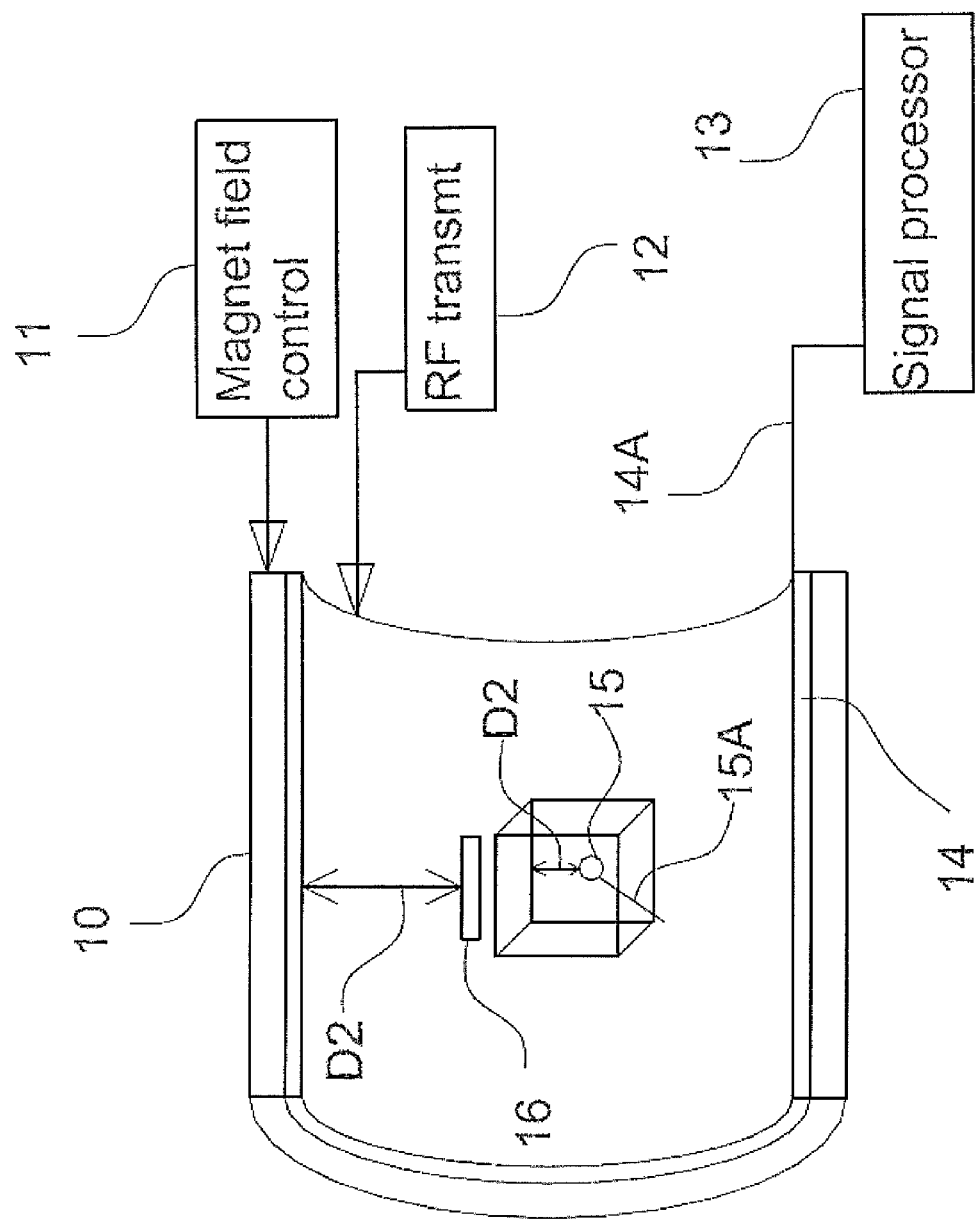
FIG. 1 is a schematic illustration of an MRI system including a first embodiment of the present invention.

In the first embodiment shown in FIG. 1, the transmit coil is defined by the body coil 14. The receive coil arrangement comprises an innermost coil loop 15 located inside the body of the patient. This is inserted by a suitable support 15A which moves the coil 15 to the required location within the patient, for example within the heart or other organ to be imaged. The receive coil arrangement further comprises a first outer coil 16 located adjacent to the innermost coil 15 but outside the body. The coil 16 can be formed by a single loop but more preferably by a phased array of loops. The receive coil arrangement further comprises a second outer coil defined by the body coil 14 surrounding the coil 16. In other arrangements a separate coil can be used for the second outer coil. In any case, the second outer coil has a signal communication cable 14A connected to the signal processing system 13 for transferring the MR signal therein to the signal processing system.

Figure 4:
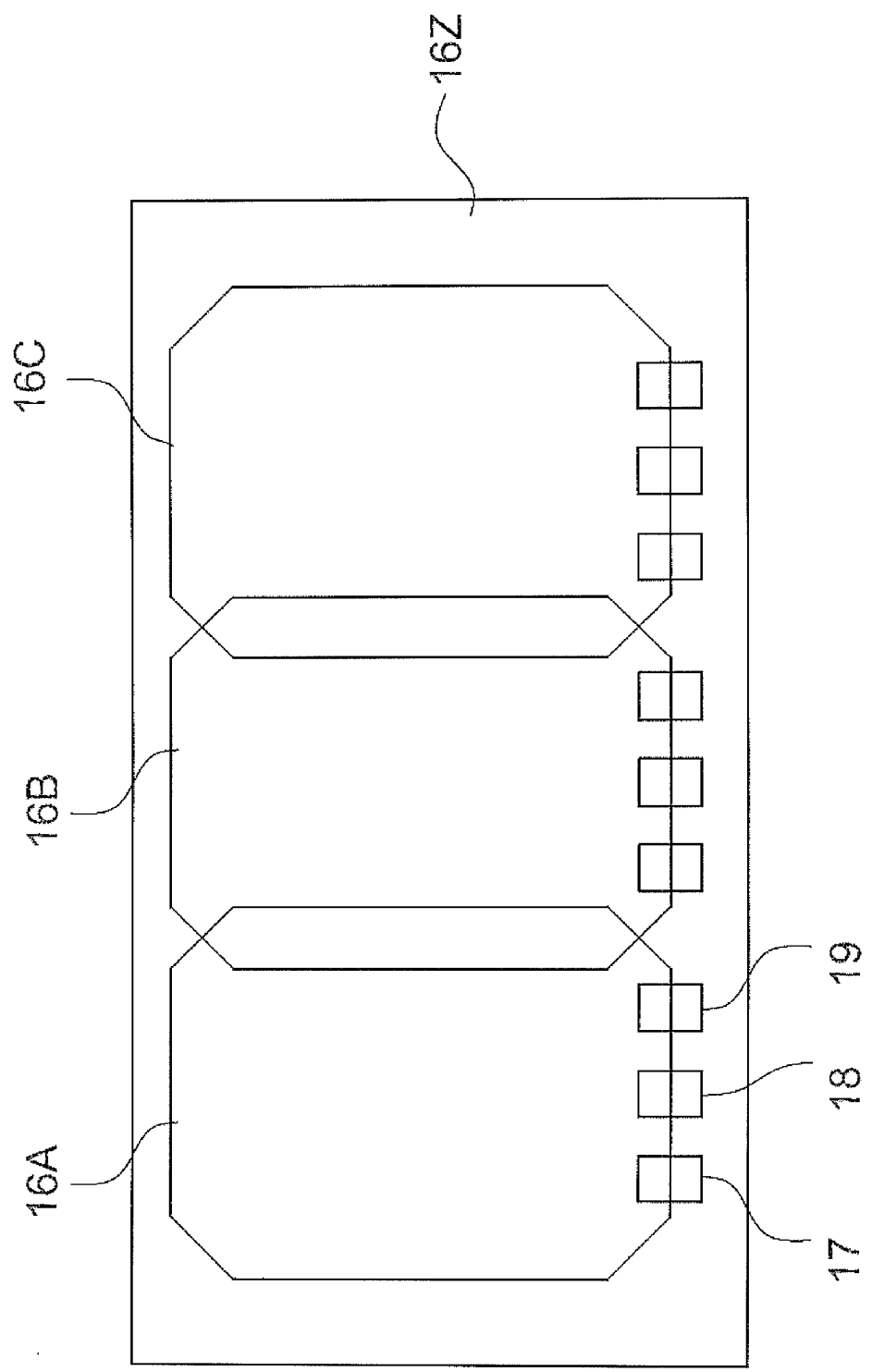
FIG. 4 is a schematic plan illustration of a top flexible portion of the head coil of FIG. 2.

In FIG. 4, a plan view is provided on the coil 16 which in this arrangement is formed by a phased array of loops 16A, 16B, 16C etc. All of the loops of the coils 15, 16 and 14 are individually tuned by a tuning component schematically indicated at 17 to a common resonant frequency for receiving said MR signal using conventional tuning devices well known to a person skilled in the art.

All of the coil loops of the coils 15 and 16 which act only in the receive stage and do not transmit the applied RF pulses in the transmit stage have therein an arrangement schematically indicated at 18 to halt current flow therein during the transmit stage so as to prevent the presence of said all coil loops from interfering with the RF pulses during the transmit stage. Devices of this type are known so that explanation of the operation is not necessary.

The loop of the innermost coil 15 is arranged to communicate the MR signal therein to the signal processing system through the loops of the first outer coil 16 and through the second outer coil 14 by inducing the MR signal onto the coil 15 and therefrom onto the coil 14.

The intention in the above arrangement is that said the coils 15 and 16 are free from a wired cable carrying the MR signal to the signal processing system.

Typically in this arrangement, the coil 16 is as close as possible to the exterior of the patient and this in turns communicates inductively to the body coil (or other coil) around the patient.

Thus the coil 16 is arranged to be located as close as physically possible to the subject and the second coil or body coil 14 is located at a position spaced from the subject greater than the that of the coil 16 so as to receive the signal inductively and transfer it to the processing unit.

The coil 15 is as close as possible to the part to be imaged and covers or surrounds as small a volume as possible so as to receive noise from as small a volume as possible and so as to receive as much signal as possible, bearing in mind that the signal falls rapidly as is passes through the tissue. This therefore generates a signal which has significantly greater signal to noise ratio than a second coil located at a greater spacing from the part. Then the signal picked up by the coil 15 is communicated inductively to the coil 16 even though there are significant losses in the inductive communication. The signal from the coil 15 is induced onto the coil 16 at an efficiency of induction (less than 100%) but sufficient that that the MR signal on coil 16 is greater than the MR signal which would be generated on coil 16 in the absence of the coil 15. That is there is a magnifying effect by providing the coil 15 close to the subject and then communicating the signal to the coil 16 despite the losses in the inductive coupling. The same effect occurs at the second inductive stage between the coil 16 and the coil 14.

It will be appreciated that the coils 16 and 14 also receive signals directly from the part being imaged which signals are added to the signals communicated inductively. However in each case, the inductively coupled signal is much greater than the directly detected signal.

Another issue which arises is that mutual inductance between the coils 14, 16 and 15 can change the tuned common resonant frequency of the loops to reduce the MR signal unacceptably. Thus the spacing between them must be sufficient such that the amount of mutual inductance does not change the tuning frequency sufficiently to interfere with the tuning to a level where the acquisition of the signal is degraded. This is of course a trade off and the actual distance spacing between the particular coils of a specific embodiment must be determined by simple experimentation to move the coils to the required position to obtain the best signal having the best signal to noise ratio.

Figure 2:
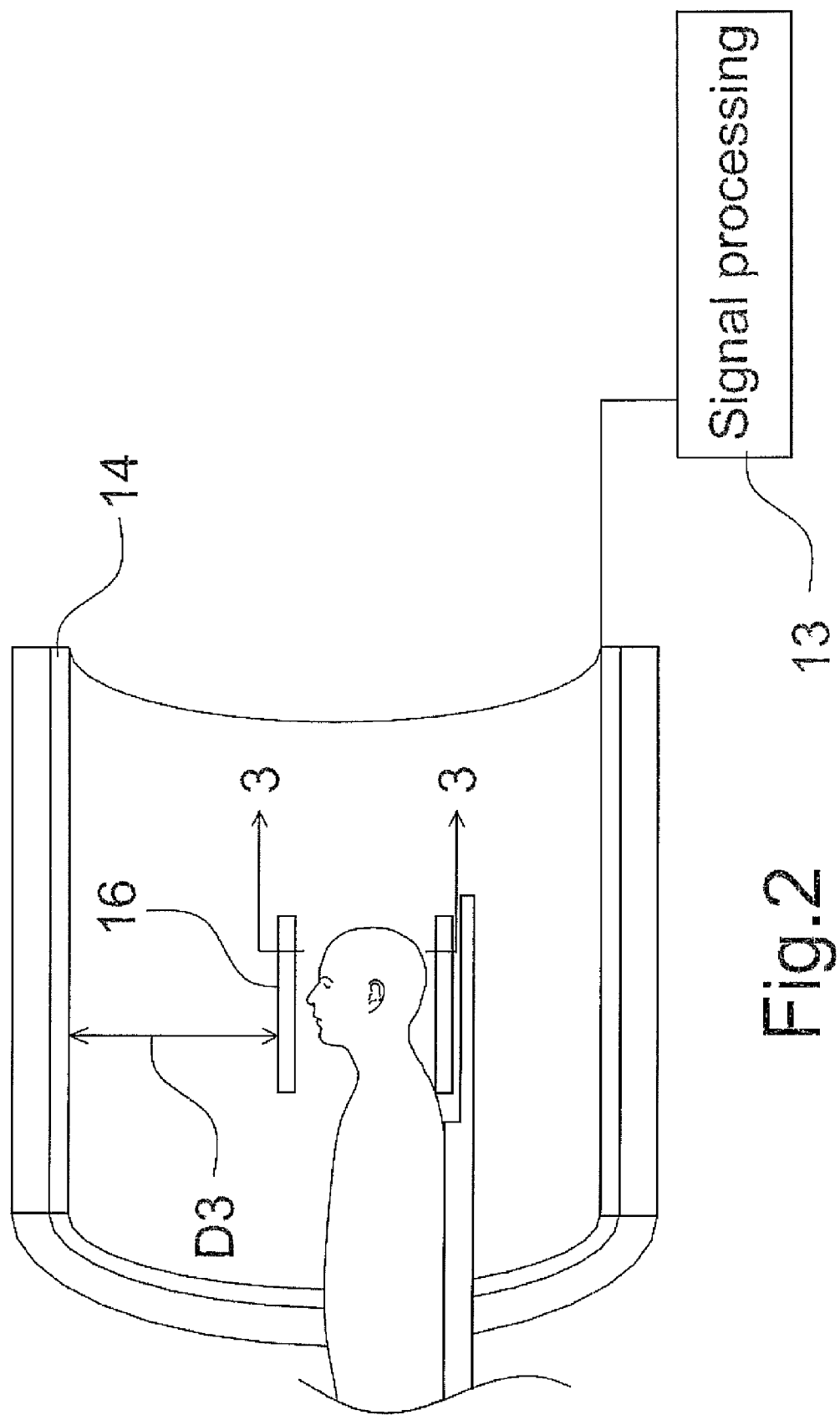
FIG. 2 is a schematic illustration of an MRI system including a second embodiment of the present invention.
Figure 3:
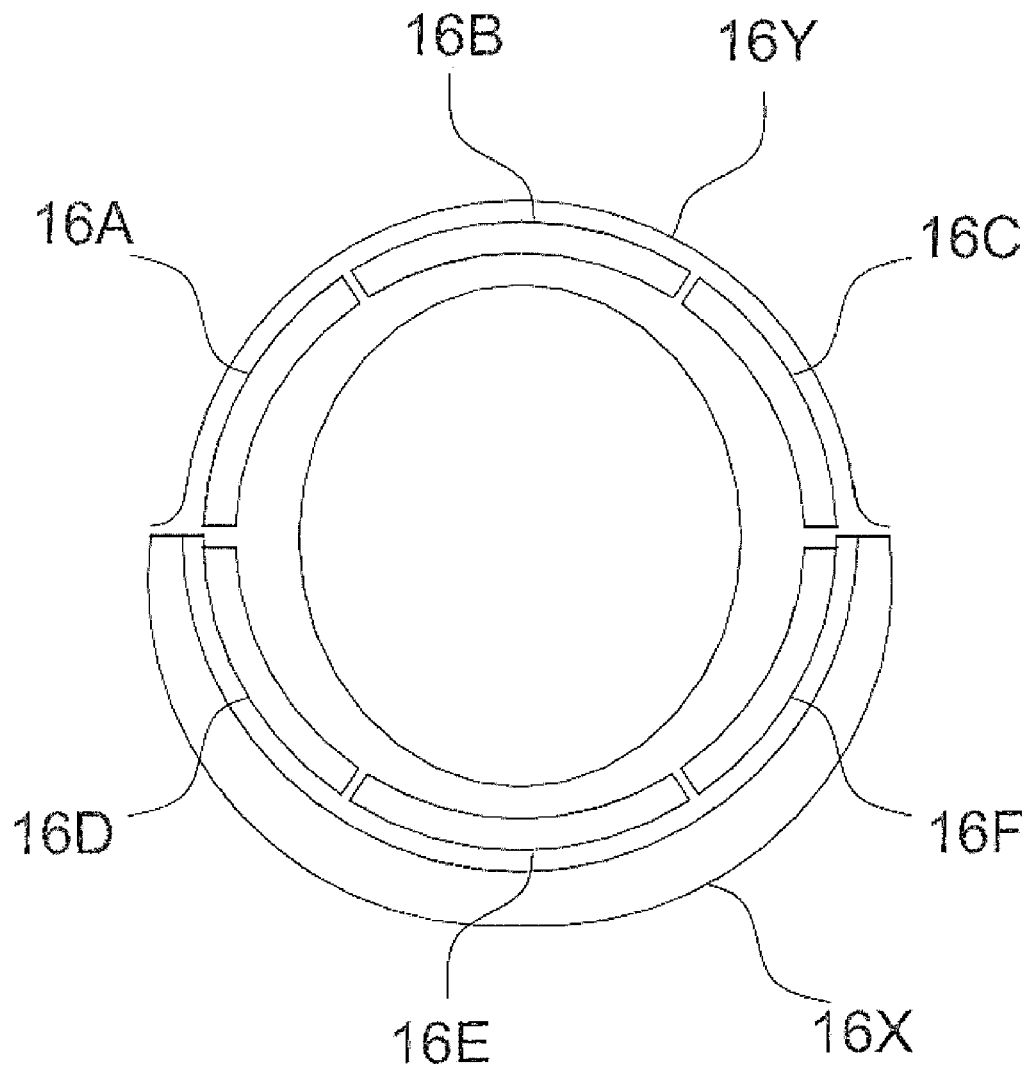
FIG. 3 is a schematic illustration of the head coil of FIG. 2 along the lines 3-3.

In the second embodiment shown in FIG. 2, there are only two coils defined by the body coil 14 and the coil 16. Thus the signal is obtained primarily by the coil 16 and is transferred inductively to the coil 14 for cable transmission to the signal processing system 13.

In this embodiment, the coil 16 is a head coil including a bottom section 16X underneath the head and a top section 16Y on top of the head. One or both sections can be flexible since each is formed simply by a carrier substrate 16Z and the conductive loops. In this embodiment 6 loops 16A to 16F are shown but different numbers can be used. Each loop includes circuit elements defining the tuning component 17 and the switch 18.

Figure 5:
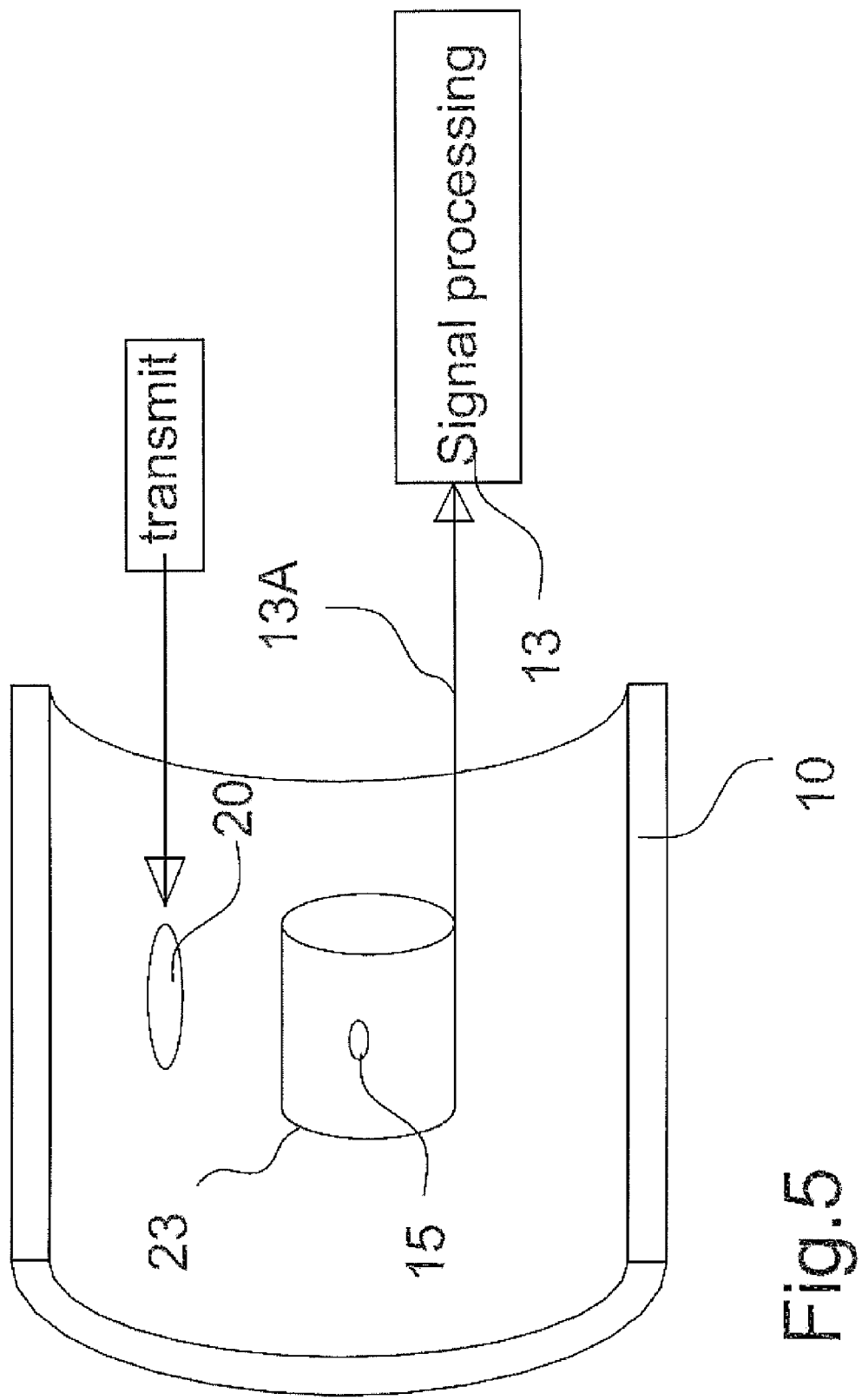
FIG. 5 is a schematic illustration of an MRI system including a third embodiment of the present invention.

In FIG. 5 is shown a further embodiment wherein the body coil is absent or is not used where there is a separate transmit coil 20 and the coil 23 is connected to the signal processing system by a cable 13A.

Figure 6:
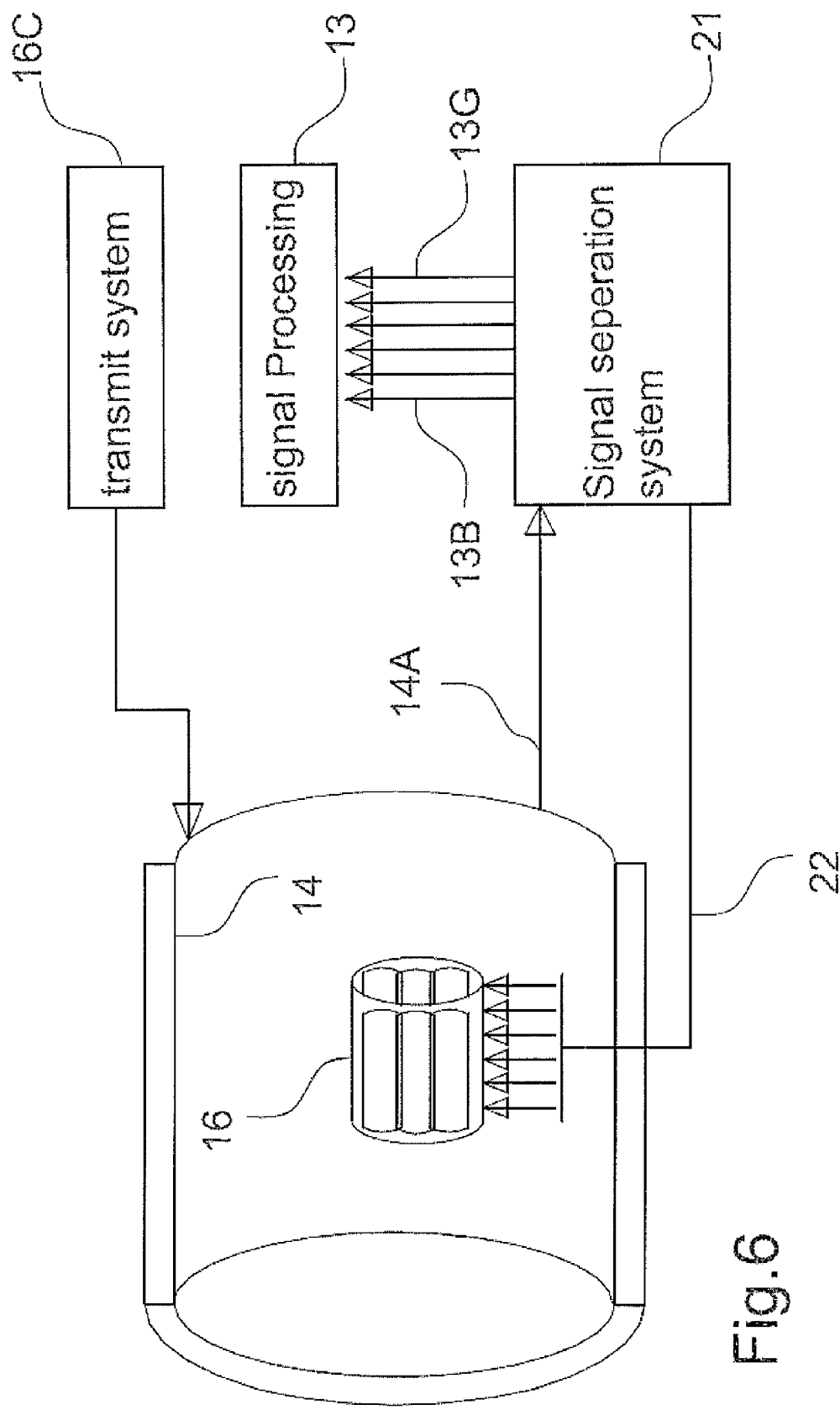
FIG. 6 is a schematic illustration of an MRI system including a fourth embodiment of the present invention.

Turning now to the embodiment shown in FIG. 6 there is shown an arrangement in which the body coil 14 is a single channel coil generating a single MR signal (compare to multi channel array coil which generate multiple signals) on a cable 14A. In order to take advantage of the high speed imaging which can be obtained by using parallel channels such as by SENS or SMASH or other more recent techniques, it is necessary to generate separate signals for separate channels 13B to 13G of the signal processing unit 13.

In this embodiment the coil 16 includes a plurality of separate loops 16A to 16F. As shown in FIG. 4, each circuit of the loops 16A to 16F includes an addressable switch 19 operable remotely to halt flow of current in the loop so that each loop can be activated in turn.

In general, there is provided an arrangement in this embodiment defined by a signal separation system 21 for generating the separate MR signals for the separate channels from the signal induced onto the separate loops 16A to 16F of the second coil 16.

In this arrangement, each loop includes an addressable switch operable remotely by a wired or wireless activation system schematically indicated at 22 to halt flow of current in the loop. In this way each loop can be activated in turn with the other loops turned off. A signal separation system 21 arranged to receive the signal from the body coil 14 and to calculate the separate MR signals, emulating the multi-channel signal 13A for the separate channels from the signal induced onto said body coil 14.

Figure 7:
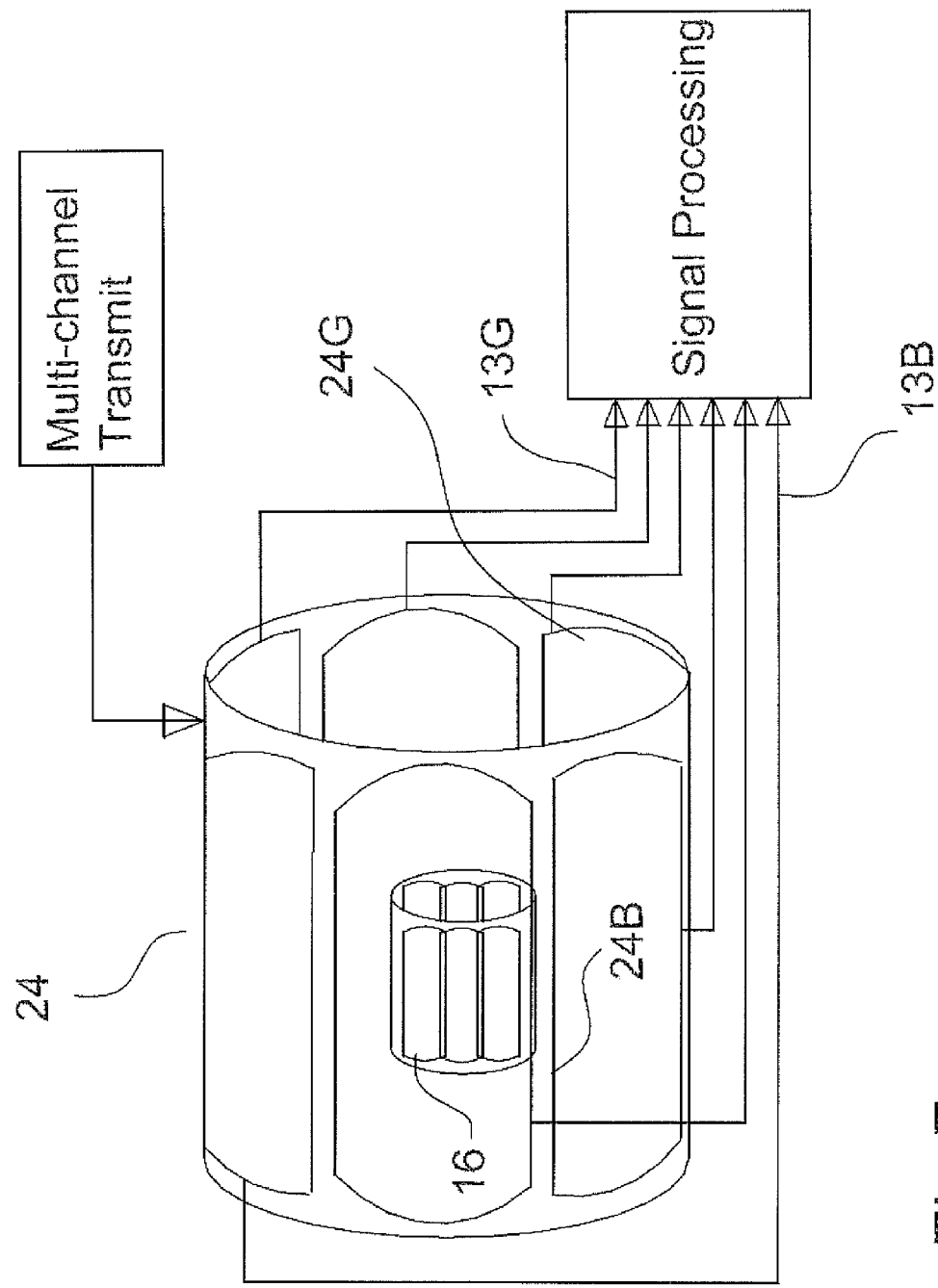
FIG. 7 is a schematic illustration of an MRI system including a fifth embodiment of the present invention.

More particularly the signal dividing system is arranged in imaging calibration sequence to use the addressable switch 22 to determine the individual effects of each of the first loops so as to determine the sensitivity profile and possibly the Noise correlation Matrix for each received MR loop signal. The calibration sequence selects each loop individually to obtain the sensitivity profile. Once the individual sensitivity profiles are known, the system will perform processing on the combined MR signal 14A and present separate outputs 13B through 13G which emulate a standard multi-channel phased array coil. Turning now to FIG. 7, there is shown an arrangement where the body coil 14, is replaced by a multichannel transmit and receive coil 24 which has separate loops 24B to 24G connected to separate channels 13B to 13G of the signal processing system 13. The coil 16 is also a coil formed by a plurality of loops as previously described, phase array body coil used for both transmit and receive coil. The communication of the signals inductively from the coil 16 to the coil 14 provides the required separate signal to each respective one of the channels and communicates the separate signals to the signal processing system 13 to generate imaging by standard parallel image methods.

Figure 8:
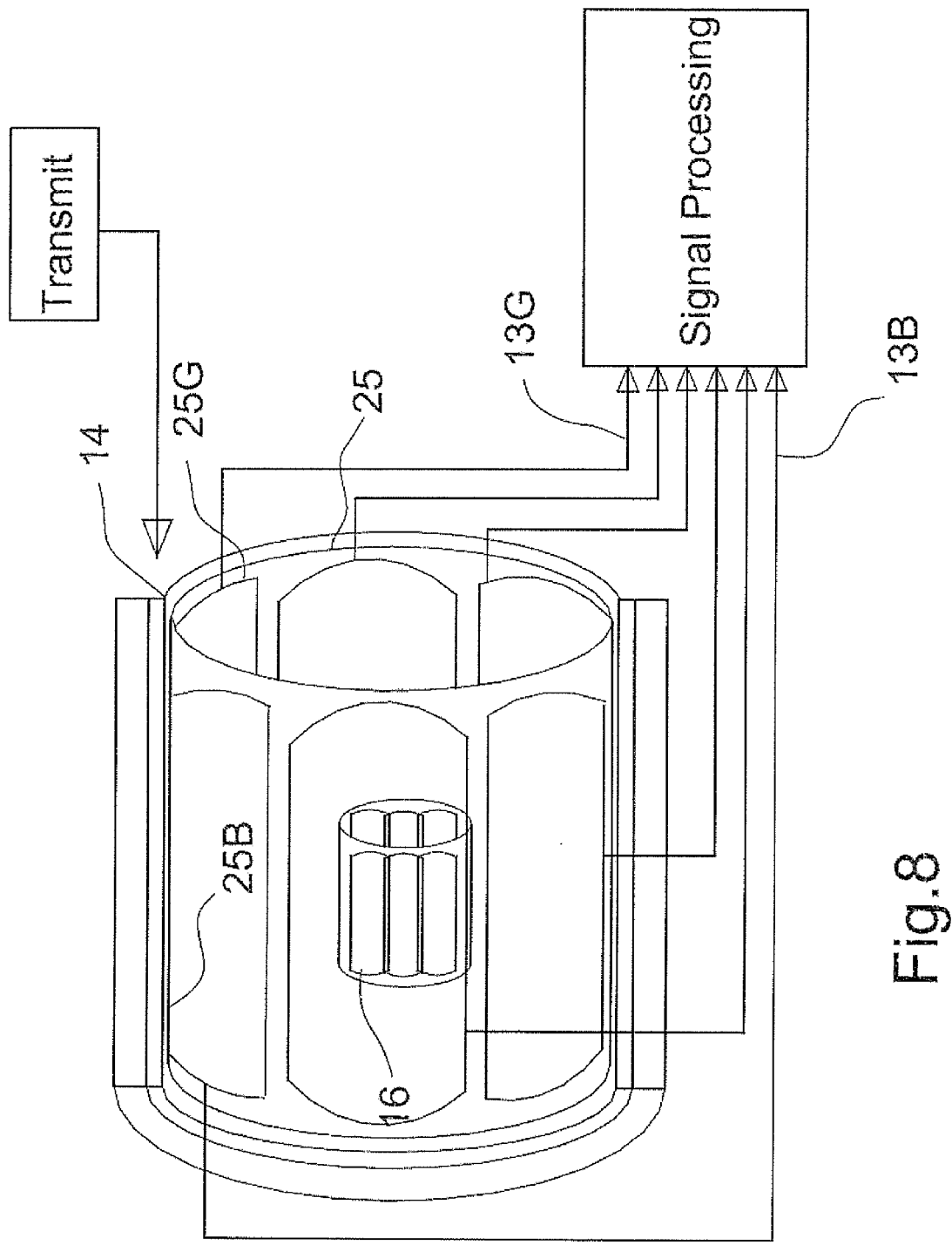
FIG. 8 is a schematic illustration of an MRI system including a sixth embodiment of the present invention.

Turning now to the embodiment shown in FIG. 8 there is shown an arrangement in which the body coil 14 is a quadrature birdcage coil which generates RE pulses to the subject to be imaged and is used for transmit coil only In order to take advantage of the high speed imaging which can be obtained by using parallel channels such as by SENSE or SMASH or other more recent techniques, it is necessary to add a phased array receive only coil in the magnet which is as close to body coil as possible, there is shown an arrangement where the phased array coil 25 which has separate loops 25B to 25G connected to separate channels 13B to 13G of the signal processing system 13. The coil 16 inductively couples the signals from the coil 16 to the coil 25. The coil 25 provides the required separate signal to each respective one of the channels and communicates separate signal to the signal processing system 13 to generate imaging by standard parallel image methods.

The invention claimed is:
1. A method for MR imaging of a body of a patient comprising operating an MR magnet with gradient coil to generate a variable magnetic field to be applied to the body of the patient;

operating an RF transmit coil arrangement for generating RF pulses in a transmit stage to be applied to the body of the patient to be imaged such that the body of the patient generates an MR signal in response to the magnetic field and the RF signal applied;

acquiring the MR signal in a receive stage;

and processing the MR signal by which an image is generated;

wherein the MR signal is acquired by:

locating at least one first receive coil inside the body of the patient so as to receive the MR signal;

locating at least one second receive coil outside the body of the patient adjacent said at least one first coil;

communicating the RF signal in said at least one second coil by a signal communication cable connected to the signal processing system;

tuning said at least one second coil and said at least one first coil to a common resonant frequency for receiving said MR signal;

preventing the presence of said first and second coils from interfering with the MR signal during the transmit stage;

and communicating the MR signal in said at least one first coil to the signal processing system through said at least one second coil by inducing the MR signal thereon onto said at least one second coil;

wherein said at least one second receive coil is located at a spacing from said at least one first receive coil such that the signal from said at least one first receive coil is induced onto said at least one second receive coil at an efficiency of induction sufficient that the MR signal on said at least one second receive coil is greater than the MR signal which would be generated in the absence of said at least one first receive coil and mutual inductance between said at least one first receive coil and said at least one second receive coil is insufficient to change the tuned common resonant frequency of said at least one first receive coil and said at least one second receive coil sufficiently to reduce the MR signal at said at least one second receive coil to a value which is less than the MR signal which would be generated in the absence of said at least one first receive coil.

2. The method according to claim 1 wherein said at least one first receive coil is a volume coil.

3. The method according to claim 1 wherein said at least one second receive coil is a volume coil.

4. The method according to claim 2 wherein said volume coil includes a plurality of loops and each loop includes an addressable switch operable remotely to halt flow of current in the loop so that each loop can be activated in turn.

5. The method according to claim 1 said at least one first receive coil is free from a wired cable carrying the MR signal to the signal processing system.

6. The method according to claim 1 said at least one second receive coil is located closely adjacent the body of the patient.

7. The method according to claim 1 wherein the signal processing system includes a plurality of channels for individual processing of separate MR signals and wherein there is provided an arrangement for generating the separate MR signals for the separate channels from the signal induced onto said at least one second receive coil.

8. The method according to claim 7 wherein said at least one first receive coil includes a plurality of separate first loops and wherein each first loop includes an addressable switch operable remotely to halt flow of current in the first loop so that each first loop can be activated in turn, wherein said at least one second receive coil comprises a single second loop and wherein there is provided a signal dividing system arranged to receive the signal from the single second receive coil and to calculate the separate MR signals for the separate channels from the signal induced onto said single second receive coil.

9. The method according to claim 7 wherein said at least one second receive coil comprises a plurality of separate loops each providing a signal to a respective one of the channels.

10. The method according to claim 1 wherein the presence of said first and second receive coils is prevented from interfering with the MR signal during the transmit stage by temporarily de-tuning the first and second receive coils from the resonant frequency.

11. The method according to claim 1 wherein said at least one second receive coil is a built in body coil carried on the magnet.

12. The method according to claim 1 wherein said at least one first receive coil is carried on a support which moves the coil to a required location within the patient.

13. A method for MR imaging of a body of a patient comprising operating an MR magnet with gradient coil to generate a variable magnetic field to be applied to the body of the patient;

operating an RF transmit coil arrangement for generating RF pulses in a transmit stage to be applied to the body of the patient to be imaged such that the body of the patient generates an MR signal in response to the magnetic field and the RF signal applied;

acquiring the MR signal in a receive stage;

and processing the MR signal by which an image is generated;

wherein the MR signal is acquired by:

providing at least one first receive coil, at least one second receive coil and at least one third receive coil;

communicating the RF signal in said at least third coil by a signal communication cable connected to the signal processing system;

tuning said at least one first receive coil, at least one second receive coil and at least one third receive coil to a common resonant frequency for receiving said MR signal;

preventing the presence of said at least one first receive coil, at least one second receive coil and at least one third receive coil from interfering with the MR signal during the transmit stage;

and communicating the MR signal in said at least one first receive coil to the signal processing system through said at least one second receive coil and at least one third receive coil by inducing the MR signal onto said at least one third receive coil;

wherein said at least one second receive coil is located at a spacing from said at least one first receive coil such that the signal from said at least one first receive coil is induced onto said at least one second receive coil at an efficiency of induction sufficient that the MR signal on said at least one second receive coil is greater than the MR signal which would be generated in the absence of said at least one first receive coil; and mutual inductance between said at least one first receive coil and said at least one second receive coil is insufficient to change the tuned common resonant frequency of said at least one first receive coil and said at least one second receive coil sufficiently to reduce the MR signal at said at least one second receive coil to a value which is less than the MR signal which would be generated in the absence of said at least one first receive coil.

14. The method according to claim 13 wherein said at least one first receive coil is arranged to be located inside the body of the patient and said at least one second receive coil is arranged immediately outside the body of the patient.

15. The method according to claim 13 wherein said at least one first receive coil is a volume coil.

16. The method according to claim 13 wherein said at least one second receive coil is a volume coil.

17. The method according to claim 16 wherein said volume coil includes a plurality of loops and each loop includes an addressable switch operable remotely to halt flow of current in the loop so that each loop can be activated in turn.

18. The method according to claim 13 said at least one first receive coil and said at least one second receive coil are both free from a wired cable carrying the MR signal to the signal processing system.

19. The method according to claim 13 said at least one second receive coil is located closely adjacent the body of the patient.

20. The method according to claim 13 wherein the signal processing system includes a plurality of channels for individual processing of separate MR signals and wherein there is provided an arrangement for generating the separate MR signals for the separate channels from the signal induced onto said at least one third receive coil.

21. The method according to claim 20 wherein said at least one first receive coil includes a plurality of separate first loops and wherein each first loop includes an addressable switch operable remotely to halt flow of current in the first loop so that each first loop can be activated in turn, wherein said at least one third receive coil comprises a single second loop and wherein there is provided a signal dividing system arranged to receive the signal from the single second receive coil and to calculate the separate MR signals for the separate channels from the signal induced onto said single second receive coil.

22. The method according to claim 20 wherein said at least one third receive coil comprises a plurality of separate loops each providing a signal to a respective one of the channels.

23. The method according to claim 13 wherein the presence of said first and second receive coils is prevented from interfering with the MR signal during the transmit stage by temporarily de-tuning the first and second receive coils from the resonant frequency.

24. The method according to claim 13 wherein said at least one third receive coil is a built in body coil carried on the magnet.

25. The method according to claim 13 wherein said at least one first receive coil is carried on a support which moves the coil to a required location within the patient.

* * * * *